US006873241B1

(12) United States Patent
Sanchez et al.

(10) Patent No.: US 6,873,241 B1
(45) Date of Patent: Mar. 29, 2005

(54) HIGH FREQUENCY TRANSFORMERS AND HIGH Q FACTOR INDUCTORS FORMED USING EPOXY-BASED MAGNETIC POLYMER MATERIALS

(76) Inventors: Robert O. Sanchez, 28 Tavalopa Dr., Los Lunas, NM (US) 87031; Shelton Gunewardena, 20347 Rim Ridge Rd., Walnut, CA (US) 91789; James V. Masi, 242 Spurwink Ave., Cape Elizabeth, ME (US) 04107

( * ) Notice: Subject to any disclaimer, the term of this patent is extended or adjusted under 35 U.S.C. 154(b) by 164 days.

(21) Appl. No.: 10/395,993

(22) Filed: Mar. 24, 2003

(51) Int. Cl.[7] ............................................. H01F 5/00
(52) U.S. Cl. ........................ 336/200; 336/83; 336/233
(58) Field of Search ............................ 336/65, 83, 200, 336/205–208, 232–233; 428/694 B, 694 BA, 106–107

(56) References Cited

U.S. PATENT DOCUMENTS

| | | | | |
|---|---|---|---|---|
| 3,255,512 A | * | 6/1966 | Lochner et al. ............. 29/602.1 |
| 4,361,822 A | | 11/1982 | Adler .......................... 335/303 |
| 4,795,698 A | | 1/1989 | Owen ............................. 435/4 |
| 4,801,912 A | * | 1/1989 | McElheny et al. ........ 336/84 M |
| 5,367,070 A | | 11/1994 | Nath ........................... 540/145 |
| 5,510,187 A | | 4/1996 | Kumar ........................ 428/425.9 |
| 5,821,453 A | | 10/1998 | Epstein ................... 174/35 MS |
| 6,137,390 A | * | 10/2000 | Tung et al. .................... 336/83 |
| 6,316,235 B1 | | 11/2001 | Mosbach ..................... 435/180 |
| 6,393,691 B1 | * | 5/2002 | Ogawa et al. .............. 29/602.1 |
| 6,483,409 B1 | * | 11/2002 | Shikama et al. ............... 336/83 |
| 6,535,093 B1 | * | 3/2003 | Murata et al. ................. 336/83 |

FOREIGN PATENT DOCUMENTS

JP        05-258956     * 10/1993

OTHER PUBLICATIONS

J.M. Manriquez, G.T. Yee, R.S. McLean, A.J. Epstein and J.S. Miller, "A Room–Temperature Molecular/Organic–Based Magnet," *Science*, vol. 252, pp. 1415–1417, Jun. 7, 1991.
J.S. Miller and A.J. Epstein, "Molecule–Based Magnets— An Overview," *Materials Research Society Bulletin*, pp. 21–30, Nov. 2000.
J.V. Masi, "Polymer Magnetics: An Overview," Paper presented at the Electrical Manufacturing & Coil Winding Expo 2002, Cincinnatti, OH, Oct. 15–17, 2002.
N. Pulsford, "Passive Integration Technology: Targeting Small Accurate RF Parts," *RF Design*, pp. 40, 44, 46, 48, Nov. 2002.
Material Safety Data Sheet for ITW Devcon 5–Minute Epoxy Gel Hardener, Dec. 4, 2001.
Material Safety Data Sheet for ITW Devcon 5–Minute Epoxy Gel Resin, Dec. 4, 2001.

* cited by examiner

*Primary Examiner*—Tuyen T Nguyen
(74) *Attorney, Agent, or Firm*—John P. Hohimer

(57) ABSTRACT

An electrical component in the form of an inductor or transformer is disclosed which includes one or more coils and a magnetic polymer material located near the coils or supporting the coils to provide an electromagnetic interaction therewith. The magnetic polymer material is preferably a cured magnetic epoxy which includes a mercaptan derivative having a ferromagnetic atom chemically bonded therein. The ferromagnetic atom can be either a transition metal or rare-earth atom.

28 Claims, 6 Drawing Sheets

HIGH FREQUENCY TRANSFORMERS AND HIGH Q FACTOR INDUCTORS FORMED USING EPOXY-BASED MAGNETIC POLYMER MATERIALS

GOVERNMENT RIGHTS

This invention was made with Government support under Contract No. DEAC04-94AL85000 awarded by the U.S. Department of Energy. The Government has certain rights in the invention.

FIELD OF THE INVENTION

The present invention relates generally to electrical components such as high Q inductors or high frequency transformers which are fabricated using magnetic materials, and specifically to such electrical components formed from epoxy-based magnetic polymer materials wherein ferromagnetic atoms are chemically bonded into the structure of the magnetic polymer materials to provide homogeneous magnetic properties.

BACKGROUND OF THE INVENTION

There is currently a need for magnetic electrical components such as inductors that operate at a radio-frequency (rf) of up to several hundred MHz or more with a high quality factor (Q). Currently, such electrical components are fabricated using air or powdered iron cores, with the powdered iron cores being used when a high Q is required. In some instances, the powdered iron cores must be machined to shape for a particular inductor application; and this substantially increases the cost of manufacture of the inductor. Additionally, machining of very small cores is difficult. What is needed is a magnetic material which can be readily molded to shape at low cost to form electrical components such as high Q inductors and transformers for use at high rf frequencies.

The present invention is directed to electrical components, including high Q inductors and high-frequency transformers, which can be formed from one or more electrically-conductive coils located proximate to a magnetic polymer material which comprises an epoxy that includes co-polymerized ferromagnetic molecules therein. An advantage of the present invention is that electrical components can be formed in many different sizes and shapes including planar chip inductors down to one millimeter in size.

Another advantage of the present invention is that electrical components with for use at high rf frequencies of up to several hundred MHz or above can be formed at low cost, and without a need for being machined to shape.

Yet another advantage is that such electrical components can be formed as planar devices with one or more substantially planar coils formed on a substrate comprising the magnetic polymer material of the present invention and with an overcoating of the magnetic polymer material being provided over the coils for encapsulation thereof and to provide a high Q at an rf frequency as well as a return magnetic path resulting in a higher inductance, L.

These and other advantages of the method of the present invention will become evident to those skilled in the art.

SUMMARY OF THE INVENTION

The present invention relates to an electrical component comprising an electrically-conductive coil and a magnetic polymer material located proximate to the coil, with the magnetic polymer material further comprising a cured epoxy that includes a mercaptan derivative, with the mercaptan derivative further including a ferromagnetic atom chemically bonded to a plurality of sulfur atoms therein. The mercaptan derivative generally comprises a polymercaptan (e.g. dimercaptopropanol or dimercaptoethanol). The ferromagnetic atom that is chemically bonded to sulfur atoms of the mercaptan derivative can comprise a transition metal atom (e.g. Fe, V, Mn, Ni, Co, Cr, or combinations thereof), or alternately a rare-earth atom (i.e. a lanthanide atom). The epoxy, in an uncured state, can comprise a diglycidol ether of bisphenol-A (DGEBA).

The electrical component fabricated according to the present invention can be an inductor, a transformer or any other type of electrical component utilizing an electromagnetic field for operation thereof. One or more coils in the electrical component can be wound on a preform (e.g. a molded preform such as a bobbin, bead, toroid, or arbitrarily-shaped core) or can be formed substantially planar on a substrate (e.g. as coiled traces). The preform or substrate can comprise the magnetic polymer material; and an optional overcoat of the magnetic polymer material can be provided over the coil on the preform or substrate.

The present invention is further related to an electrical component (e.g. an inductor, transformer, etc.) that comprises an electrically-conductive coil and a magnetic polymer material located proximate to the coil, with the magnetic polymer material being a cured epoxy (e.g. formed from a diglycidol ether of bisphenol-A) that includes a plurality of mercaptan molecules (e.g. mercaptopropanol or mercaptoethanol) co-polymerized therewith, and with each pair of the mercaptan molecules being chemically bonded to a ferromagnetic transition metal atom. The electrical component can be formed with the coil wound around a preform which can comprise the magnetic polymer material, and with the coil optionally being overcoated with the magnetic polymer material. Alternately, the coil can be formed on a substrate (also termed herein a substrate preform) as a substantially planar coil, with the substrate comprising the magnetic polymer material and/or with the coil being overcoated with the magnetic polymer material. The transition metal atoms chemically bonded within the magnetic polymer material can comprise iron (Fe), vanadium (V), manganese (Mn), nickel (Ni), cobalt (Co), chromium (Cr), or combinations thereof.

The present invention also relates to a method for forming an electrical component that comprises the steps of providing a preform, forming a coil on the preform, overcoating the coil on the preform with a magnetic polymer material comprising a mixture of a partially-cured epoxy including a mercaptan derivative, and fully curing the epoxy, thereby co-polymerizing the epoxy and the mercaptan derivative. The mercaptan derivative, which can comprise a polymercaptan such as dimercaptopropanol or dimercaptoethanol, includes a ferromagnetic atom chemically bonded to a plurality of sulfur atoms therein. The ferromagnetic atom can comprises a transition metal atom or a rare-earth atom. The epoxy, in an uncured state, can comprise a diglycidol ether of bisphenol-A (DGEBA).

The electrical component can comprise an inductor or a transformer. The preform can comprise the magnetic polymer material; and in certain embodiments of the present invention, the step of providing the preform can comprise molding the preform from the magnetic polymer material. The step of forming the coil on the preform can comprise forming a substantially planar coil on the preform, or alternately winding at least one turn of wire on the preform.

Additional advantages and novel features of the invention will become apparent to those skilled in the art upon examination of the following detailed description thereof when considered in conjunction with the accompanying drawings.

The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1A:
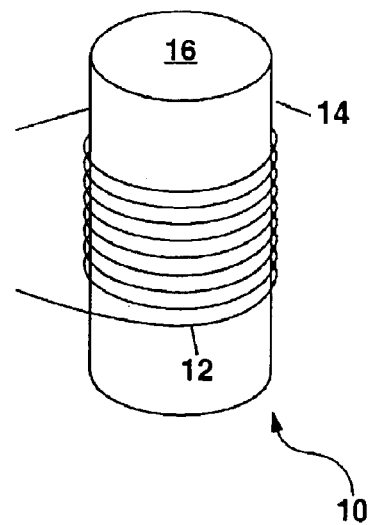
FIGS. 1A–1D schematically illustrate examples of electrical components that can be formed according to the present invention.
Figure 1B:
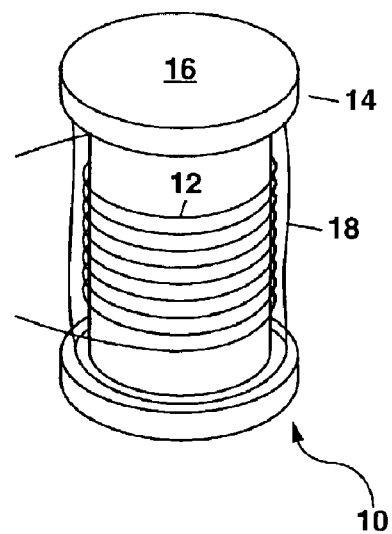
Figure 1C:
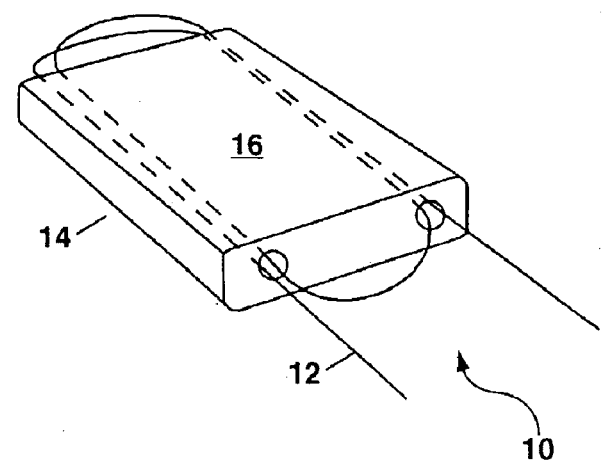
Figure 1D:
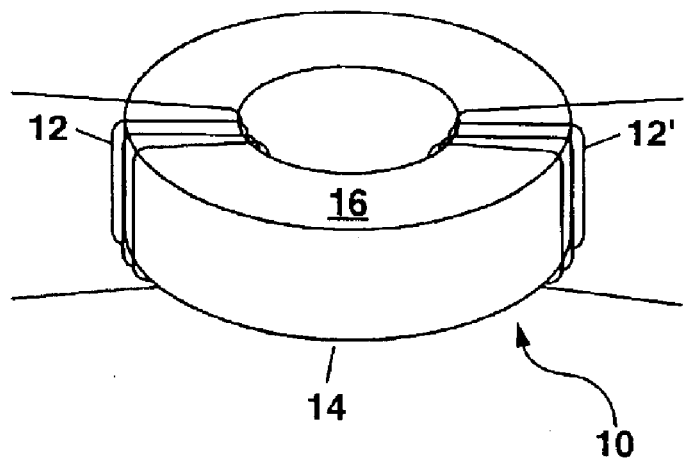

Referring to FIGS. 1A–1D, there are shown examples of electrical components 10, in the form of inductors and transformers that can be formed according to the present invention. FIGS. 1A–1C schematically illustrate inductors formed by winding an electrically-conductive coil 12 on a preform 14; whereas FIG. 1D shows a transformer formed by winding a pair of coils 12 and 12' on a toroidal preform 14. The pair of coils 12 and 12' can be wound side by side as shown in FIG. 1D or concentrically (i.e. one upon the other). An inductor is an electrical component, which comprises a coil of wire to generate a magnetic field when an electrical current is passed through the coil and to store energy in the form of the magnetic field. The term "coil" as used herein includes one or more turns of wire, and is also intended to include a loop of wire (i.e. a single turn of wire).

Figure 2:
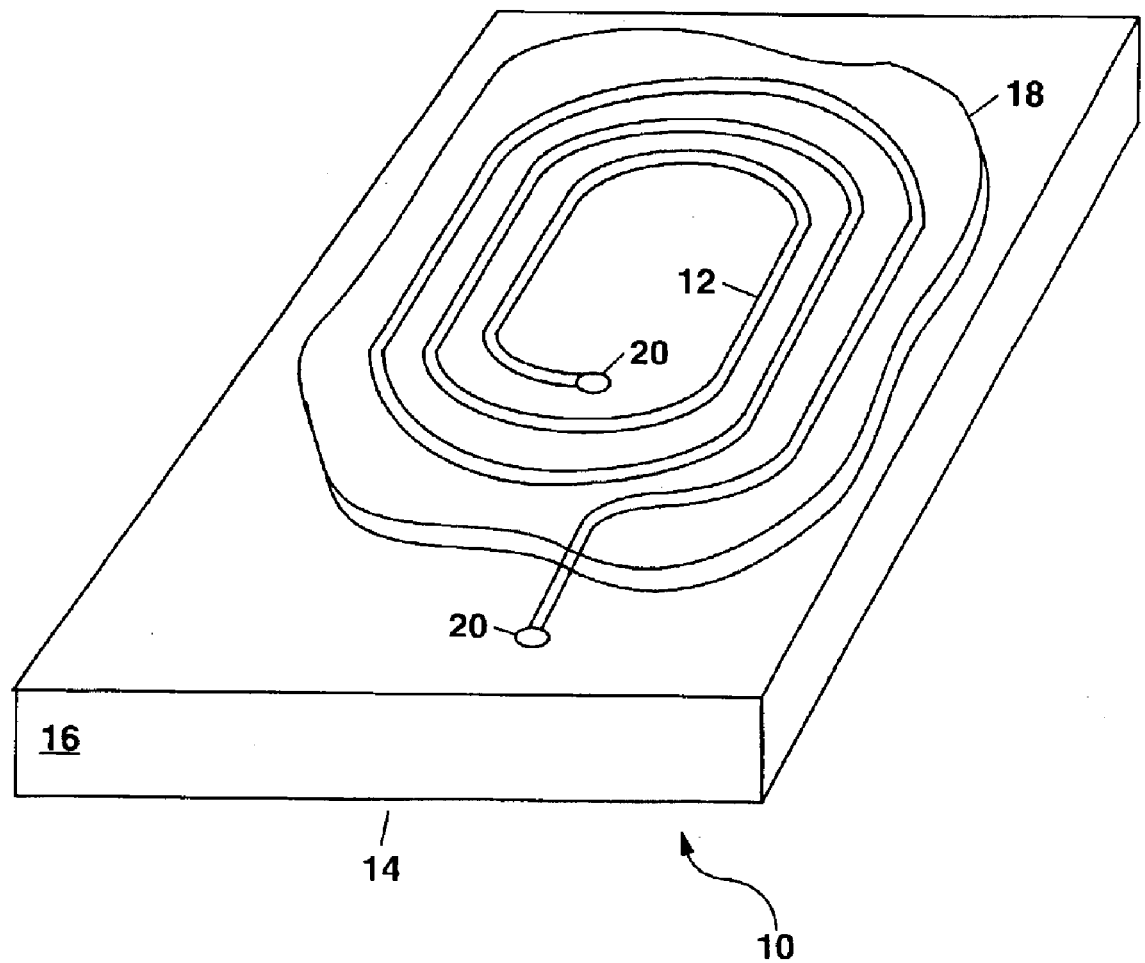
FIG. 2 shows an example of an electrical component formed according to the present invention with a substantially planar coil formed on a substrate comprising the magnetic polymer material and overcoated with a layer of the magnetic polymer material.

FIGS. 1A–1D show that the preform 14 can have many different shapes, with the preform 14 being a cylindrical core in FIG. 1A, a bobbin in FIG. 1B, a bead core in FIG. 1C, and a toroid in FIG. 1D. The term "preform" as used herein refers to any material of arbitrary shape or form proximate to which one or more electrically-conductive coils 12 can be disposed to alter or enhance an electromagnetic property of the coil(s) 12, or onto which the coil(s) 12 can be formed or placed for support. In FIG. 2, the preform 14 can be in the form of a substrate whereon a substantially planar coil 12 is formed as will be described in detail hereinafter (e.g. to form a chip inductor or a planar transformer). Such a substrate is also termed herein a substrate preform.

In FIGS. 1A–1D and FIG. 2, the preform 14 generally comprises a magnetic polymer material 16 which is formed according to the present invention. Additionally, as shown in FIG. 1B and FIG. 2, the magnetic polymer material 16 can be optionally provided as an overcoating 18 over the coil 12. The overcoating of the magnetic polymer material 16, which is electrically insulating with a resistivity on the order of $10^{12}$ $\Omega \cdot cm$, can thus act to encapsulate the coil 12 thereby increasing electromagnetic coupling within the component 10, can electrically insulate adjacent turns of the coil 12, can hermetically seal the coil 12, and can prevent the possibility of eddy currents flowing through the magnetic polymer material 16 (e.g. for a transformer) which might otherwise occur if a powdered iron core were used.

The magnetic polymer material 16 comprises a cured epoxy that includes a co-polymerized host compound which includes ferromagnetic atoms therein thereby making the epoxy magnetic. The co-polymerized host compound preferably comprises a mercaptan derivative such as dimercaptopropanol or dimercaptoethanol which is chemically bonded to the ferromagnetic atom prior to being added to the epoxy for co-polymerization therewith. Alternately, the ferromagnetic atom can be chemically bonded to a mercaptan epoxy hardener. Mercaptans (also termed thiols) are sulfur-containing organic compounds with the general formula RSH where R is any radical.

Figure 3:
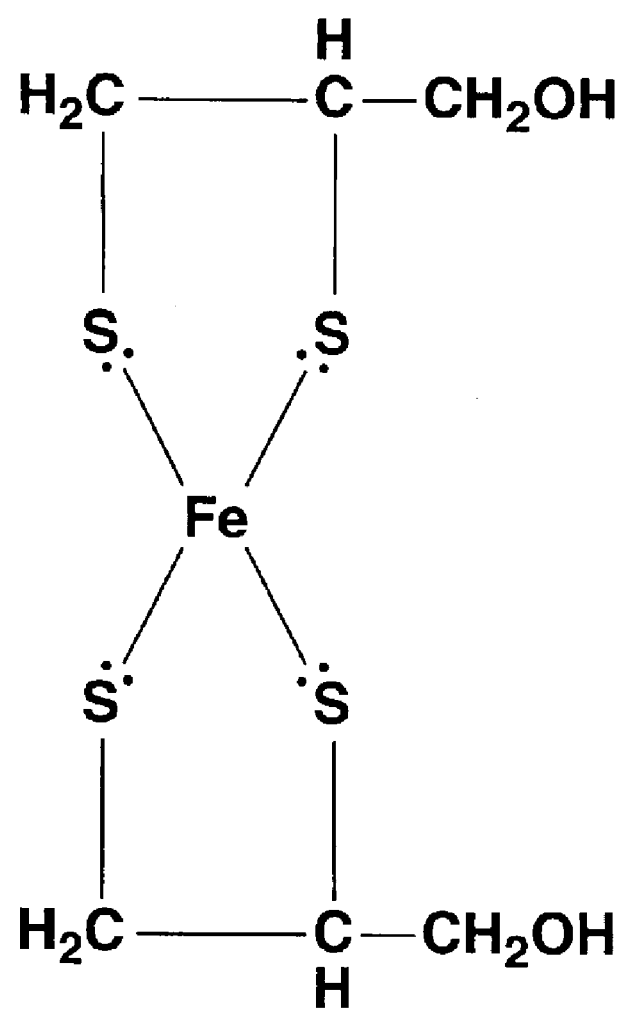
FIG. 3 shows a molecular diagram of dimercaptopropanol with iron (Fe) chemically bonded thereto, with the Fe being representative of a ferromagnetic atom from the transition metal or lanthamide series of the periodic table.
Figure 4:
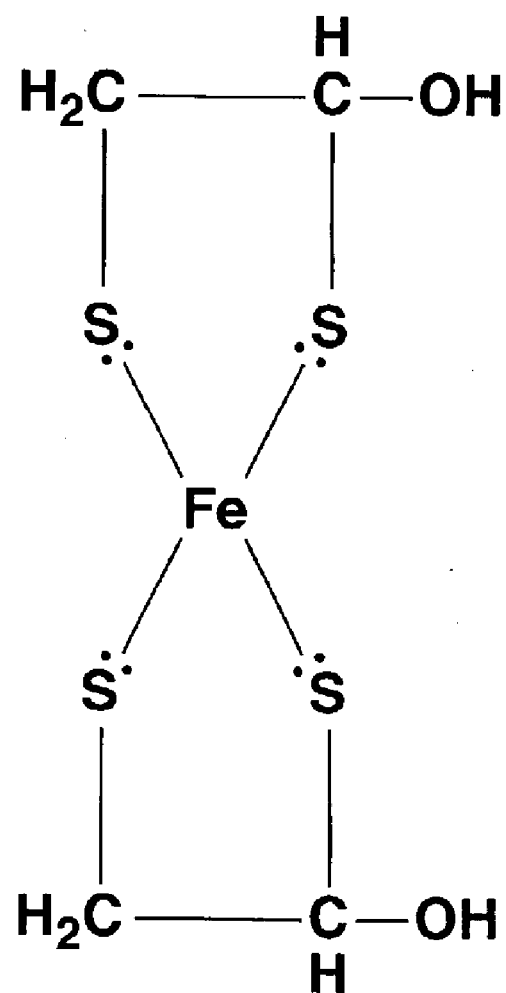
FIG. 4 shows a molecular diagram of dimercaptoethanol with Fe chemically bonded thereto, with the Fe being representative of a ferromagnetic atom from the transition metal or lanthanide series of the periodic table.

FIGS. 3 and 4 show, respectively, molecular diagrams of dimercaptopropanol and dimercaptoethanol with iron (Fe) as a representative ferromagnetic ion being chemically bonded to a plurality of sulfur (S) atoms therein. Those skilled in the art will understand that other ferromagnetic atoms from the transition metal series (e.g. V, Mn, Ni, Co, Cr) and from the lanthamide (i.e. rare-earth) series of the periodic table can be substituted for Fe in the mercaptan derivative to form the magnetic polymer material 16. The chemical composition of the mercaptan derivative can be selected to provide from generally 2–4 sulfur (S) atoms for chemical bonding with a particular ferromagnetic atom. The term "atom" as used herein is also intended to include atoms in ionic form.

The mercaptan derivative can be prepared by combining stoichiometric amounts of a chloride (e.g. ferric chloride also termed $FeCl_3$) or a carbonate (e.g. ferric carbonate also termed $Fe_2(CO_3)_3$) containing the transition metal or rare-earth atom of interest together with a mercaptan (e.g. mercaptopropanol or mercaptoethanol) and a stoichiometric amount of an epoxy hardener (e.g. comprising a polyamine curing agent such as $R(NH_2)_2$ also termed diamine). The preferred composition for obtaining optimum curing of the magnetic epoxy is 1 mole Fe as $FeCl_3$:1 mer of mercaptan:1 mer of epoxy hardener:1 mer of epoxy resin.

In general, the stoichiometric amount of polymercaptan added to the epoxy hardener should be sufficient to provide 1–2 atoms of the transition metal (e.g. Fe, V, Mn, Ni, Co, Cr, etc.) or rare-earth to be a part of one mer of a resin/hardener mixture wherefrom the cured magnetic epoxy is formed. This results in the transition metal or rare-earth ions being located on 2–4 nanometer centers in the cured magnetic epoxy thereby providing a permeability of 4–10 at an rf frequency of 500 MHz and producing a quality factor (Q) in the range of about 100–200 for an inductor 10 having a coil 12 comprising five turns of #34 wire wound on a toroidal preform 14 formed from the magnetic epoxy having an inner diameter of 2 millimeters and an outer diameter of 4 millimeters. The magnetic polymer material 16 formed as an epoxy as described above is expected to be thermally stable up to about 200° C.

The chloride or carbonate containing the transition metal or rare-earth atoms can be added as solid granules to the epoxy hardener and mixed together prior to adding the mercaptan. The mixing can be carried out in a stirred reaction chamber. In the case of ferric chloride or ferric carbonate, a color change in a solution of the combined materials from relatively clear to dark blue or black will indicate that the iron atoms have been chemically bonded to the sulfur atoms of the mercaptan host compound to form the polymercaptan.

A transition metal chloride (e.g. $FeCl_3$) or a rare-earth chloride is generally to be preferred over a transition metal carbonate or a rare-earth carbonate since the chloride compound when combined in solution with the epoxy hardener and the mercaptan host compound produces chlorine ions which more readily break bonds in the mercaptan host compound in order to form a tightly bound complex of polymercaptan with the transition metal or rare-earth ions sequestered therein. The term "polymercaptan" as used herein refers to a molecule formed from a plurality of mercaptan molecules, with the polymercaptan molecule having a plurality of sulfur atoms therein.

Once the polymercaptan has been thoroughly mixed into the epoxy hardener as described above, the hardener can then be mixed in a stoichiometric amount with a diepoxy (also termed herein a resin) with the hardener and polymercaptan both being co-polymerized with the resin during curing at a temperature which can range from room temperature up to an elevated temperature near the glass transition temperature of the fully-cured magnetic epoxy. The ratio of the hardener (including the polymercaptan) to the resin can be, for example, 1:2 when the hardener comprises a diamine curing agent and the resin comprises a diglycidol ether of bisphenol-A (also termed DGEBA). The polyamine hardener and DGEBA resin, which can be produced from a condensation reaction of epichlorohydrin and bisphenol-acetone, is commercially available in many two-part epoxy kits.

Figure 5:
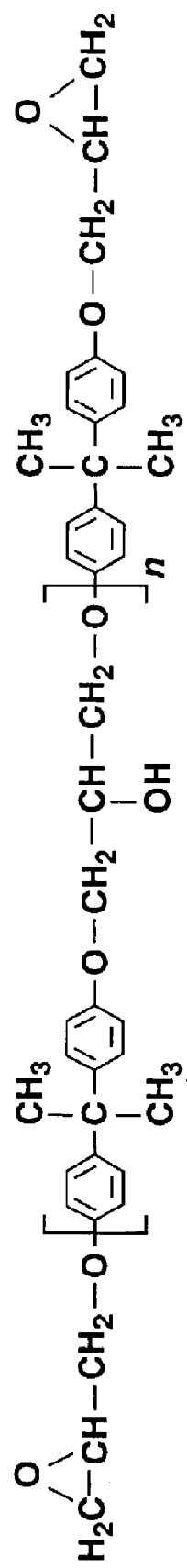
FIG. 5 shows the chemical formula for an epoxy resin comprising a diglycidol ether of bisphenol-A (DGEBA).

Those skilled in the art will understand that there are many different epoxy resin/hardener systems and many different compositions of resins and hardeners within each epoxy system to which the teachings of the present invention can be applied and which can be used to form the electrical component 10. Thus, for example, in the DGEBA resin/polyamine hardener epoxy system with the formula for DGEBA given as shown in FIG. 5 with epoxide groups at each end and a repeat unit in the middle enclosed in brackets, the number n of repeat units can range from 0 up to about 25. As the number, n, of repeat units in the DGEBA resin increases, the viscosity or melting point of the DGEBA resin increases. Additionally, those skilled in the art will understand that other types of epoxy can be substituted for the DGEBA resin/polyamine hardener epoxy system in forming the magnetic epoxy of the present invention, including epoxies based on resins that comprise glycidyl ethers of novolac resins, tetrafunctional glycidyl amines and aliphatic resins (e.g. n-butyl glycidyl ether, glycidyl ethers of alcohols, and 1,4-butanediol diglycidyl ethyl) and further based on hardeners that comprise amine curing agents (e.g. aliphatic amines such as diethylene triamine or aminoethyl piperazine, or aromatic amines such as metaphenylenediamine or methylene dianiline), anhydride curing agents (e.g. cyclic anhydrides such as nadic methyl anhydride or phthalic anhydride).

In the case of an epoxy comprising a hardener that further comprises a mercaptan (e.g. a polymercaptan), the chloride or carbonate containing the ferromagnetic atom can be mixed directly into the hardener to produce a mercaptan derivative (e.g. polymercaptan) that contains the ferromagnetic atom sequestered therein. As an example, six grams of ferric chloride in granular form can be added to 10 grams of a mercaptan hardener and thoroughly mixed together to sequester the iron atoms within the mercaptan hardener before combining the resultant mixture with a stoichiometric amount of the resin to form the cured magnetic epoxy. As previously mentioned, a color change from relatively clear to dark blue/black in the mixture of the ferric chloride and the hardener will indicate that the iron atoms have been chemically bonded to the sulfur atoms of the polymercaptan thereby completing the sequestration of the iron atoms within the polymercaptan.

Once the epoxy resin and hardener with the mercaptan derivative having the ferromagnetic atoms sequestered therein have been mixed together to begin the curing process for the magnetic epoxy, the magnetic epoxy can be molded into a precise size and shape required to form the preform 14. This can be done, for example, using a one- or two-part mold that is formed from a material to which the cured magnetic epoxy does not strongly adhere such as a mold formed from an acetal homopolymer (e.g. DELRIN). Alternately, the mold can be made of metal or other relatively hard material and coated with a release agent, if needed. The magnetic epoxy, after being mixed, can be poured or urged into the mold and allowed to remain there until fully cured with or without added heat. The simultaneous molding of a plurality of preforms 14 can be pre-formed using a batch process. The term "molding" as used herein is intended to refer to any process whereby a material is pressed or formed into a particular shape, and includes casting, extrusion, and injection or vacuum molding. A substrate preform 14 as shown in FIG. 2 can also be formed by molding, by coating upon a surface of another material, or by rolling the mixed epoxy prior to complete curing, or after heating and softening thereof.

Once the preform 14 has been made from the magnetic polymer material 16, one or more coils 12 can be wound on the preform 14 as schematically illustrated in the examples of FIGS. 1A–1D. The exact number of wire turns for the coil 12 will depend on the type of electrical component 10 being formed (i.e. an inductor or transformer), and on the desired electrical characteristics of the component 10 (e.g. a magnetic permeability of the magnetic polymer material 16, a current-carrying capacity of each coil 12, an inductance of the coil 12 for an inductor, a ratio of the number of turns for a pair of magnetically-coupled coils 12 used forming a transformer, etc.).

In some embodiments of the present invention, an air coil 12 comprising one or more turns of wire can be pre-formed and inserted into the mold prior to or after filling the mold with the uncured magnetic epoxy. In this way, the coil 12 can be completely encased within the cured magnetic epoxy to form the electrical component 10 without the need for first forming the preform 14 and subsequently winding the coil 12 about the preform 14.

The completed electrical component 10 of the present invention can be enclosed within a non-magnetic package (not shown). Alternately, an overcoating 18 of the magnetic polymer material 16 can be formed over the component 10 as shown schematically in the examples of FIGS. 1B and 2. The overcoating 18 can comprise the same type of two-part epoxy having the transition metal or rare-earth atoms sequestered within the mercaptan derivative as previously described for forming the preform 14. The overcoating 18 can be applied by dipping, coating, spreading, squeegeeing, rolling or molding after the magnetic epoxy has been mixed and prior to complete curing thereof. The overcoating 18 can then be cured at room temperature, or at an elevated temperature. The provision of an overcoating 18 is advantageous since this can enhance the magnetic properties (e.g. inductance or magnetic coupling) of the component 10, or reduce its size as compared to a similar component 10 formed with the same number of turns for the coil 12 but without the overcoating 18. Additionally, the overcoating 18 can be used to form a package for the electrical component 10. The term "overcoating" as used herein can refer to a coating, or to a quantity of the magnetic polymer material 18 of arbitrary shape formed over the coil 12.

In certain embodiments of the present invention, the preform 14 can comprise a magnetic material (e.g. iron or ferrite) or a dielectric material rather than being formed from the magnetic polymer material 16. In these embodiments of the present invention, an overcoating 18 of the magnetic polymer material 16 can be provided over the coil 12 to insulate and protect the coil 12 while enhancing the magnetic properties of the electrical component 10. The magnetic polymer material 16 provides a high dielectric constant ($\epsilon$=18) and the high resistivity ($\rho$=$10^{10}$–$10^{12}$ $\Omega$·cm) for the overcoating 18.

In the electrical component 10 in the example of FIG. 2, the coil 12 can be formed on the substrate preform 14 by blanket deposition, plating or bonding of an electrically-conductive layer (e.g. a metal layer comprising aluminum, copper, silver or gold) followed by patterning using conventional masking and etching processes as known to the art of semiconductor devices and printed-circuit boards. This results in a substantially planar coil 12, which is also termed a coiled trace. Those skilled in the art will understand that there are other ways of forming the substantially planar coil 12 in FIG. 2. For example, the substantially planar coil 12 can be formed from a laser-deposited metal (e.g. copper or silver), or from a metallic ink.

In FIG. 2, one or more electrical connection points 20 can be provided for the coil 12 for the attachment of external lead wires (not shown), or to form electrical connections (e.g. by solder or ball bonds) from the coil 12 to a supporting substrate (not shown). The electrical connection point 20 at the center of the coil 12 can include an electrically-conductive via formed through the substrate preform 14 to allow an electrical connection to be made to the center of the coil 12 from a backside of the substrate 14. This can be advantageous when the electrical component 10 is to be mounted on an edge thereof, or when a layer of the magnetic polymer material 18 is to be overcoated over the coil 12 as shown in FIG. 2. The provision of a substantially planar coil 12 on each side of the substrate preform 14 in FIG. 2 can be used to form a two-sided chip inductor or a planar transformer.

The matter set forth in the foregoing description and accompanying drawings is offered by way of illustration only and not as a limitation. Other applications and variations of the present invention will become evident to those skilled in the art. For example, in certain embodiments of the present invention the magnetic polymer material 16 need not support the coil 12, but can be provided instead as a magnetic core that is moveable within a coil 12 to form a tunable inductor. In these embodiments of the present invention, the magnetic polymer material core can be attached to a tuning screw to vary the inductance as the tuning screw is adjusted to move the core inward or outward relative to the coil 12. The actual scope of the invention is intended to be defined in the following claims when viewed in their proper perspective based on the prior art.

What is claimed is:

1. An electrical component, comprising:
    (a) an electrically-conductive coil; and
    (b) a magnetic polymer material located proximate to the coil, with the magnetic polymer material further comprising a cured epoxy including a mercaptan derivative, with the mercaptan derivative further including a ferromagnetic atom chemically bonded to a plurality of sulfur atoms therein.

2. The electrical component of claim 1 wherein the mercaptan derivative comprises a polymercaptan.

3. The electrical component of claim 1 wherein the mercaptan derivative comprises dimercaptopropanol or dimercaptoethanol.

4. The electrical component of claim 1 wherein the ferromagnetic atom comprises a transition metal atom.

5. The electrical component of claim 4 wherein the transition metal atom is selected from the group consisting of iron (Fe), vanadium (V), manganese (Mn), nickel (Ni), cobalt (Co), chromium (Cr) and combinations thereof.

6. The electrical component of claim 1 wherein the ferromagnetic atom comprises a rare-earth atom.

7. The electrical component of claim 1 wherein the epoxy, in an uncured state, comprises a diglycidol ether of bisphenol-A (DGEBA).

8. The electrical component of claim 1 in the form of an inductor.

9. The electrical component of claim 1 in the form of a transformer.

10. The electrical component of claim 1 wherein the coil comprises a substantially planar coil formed on a substrate.

11. The electrical component of claim 10 wherein the coil is overcoated with the magnetic polymer material.

12. The electrical component of claim 10 wherein the substrate comprises the magnetic polymer material.

13. The electrical component of claim 1 wherein the coil is wound on a preform.

14. The electrical component of claim 13 wherein the coil on the preform is overcoated with the magnetic polymer material.

15. The electrical component of claim 13 wherein the preform comprises the magnetic polymer material.

16. The electrical component of claim 13 wherein the preform is a molded preform.

17. An electrical component, comprising:
    (a) an electrically-conductive coil; and
    (b) a magnetic polymer material located proximate to the coil, with the magnetic polymer material further comprising a cured epoxy including a plurality of mercaptan molecules co-polymerized therewith, with each pair of the mercaptan molecules being chemically bonded to a ferromagnetic transition metal atom.

18. The electrical component of claim 17 in the form of an inductor.

19. The electrical component of claim 17 in the form of a transformer.

20. The electrical component of claim 17 wherein the coil comprises a substantially planar coil formed on a substrate.

21. The electrical component of claim 20 wherein the coil is overcoated with the magnetic polymer material.

22. The electrical component of claim 20 wherein the substrate comprises the magnetic polymer material.

23. The electrical component of claim 17 wherein the coil is wound around a preform.

24. The electrical component of claim 23 wherein the coil is overcoated with the magnetic polymer material.

25. The electrical component of claim 23 wherein the preform comprises the magnetic polymer material.

26. The electrical component of claim 17 wherein the epoxy, in an uncured state, comprises a diglycidol ether of bisphenol-A (DGEBA).

27. The electrical component of claim 17 wherein the mercaptan molecules comprise mercaptopropanol or mercaptoethanol.

28. The electrical component of claim 17 wherein the transition metal atom is selected from the group consisting of iron (Fe), vanadium (V), manganese (Mn), nickel (Ni), cobalt (Co), chromium (Cr) and combinations thereof.

* * * * *